United States Patent [19]

Ishioka et al.

[11] Patent Number: 5,101,255
[45] Date of Patent: Mar. 31, 1992

[54] AMORPHOUS PHOTOELECTRIC CONVERSION DEVICE WITH AVALANCHE

[76] Inventors: Sachio Ishioka, Burlingame, Calif.; Yukio Takasaki, Kawasaki, Japan; Tadaaki Hirai, Koganei, Japan; Kazutaka Tsuji, Hachioji, Japan; Tatsuo Makishima, Mitaka, Japan; Yasuhiko Nonaka, Mobara, Japan; Tatsuro Kawamura, Tama, Japan; Takashi Yamashita; Kazuhisa Taketoshi, both of Sagamihara, Japan; Keiichi Shidara, Tama, Japan; Fumihiko Ando, Yokohama, Japan; Kenkichi Tanioka, Tokyo, Japan

[21] Appl. No.: 384,080
[22] Filed: Jul. 24, 1989

Related U.S. Application Data

[63] Continuation of Ser. No. 143,388, Jan. 13, 1988, abandoned.

[30] Foreign Application Priority Data

Jan. 14, 1987 [JP] Japan .................................. 62-4866

[51] Int. Cl.$^5$ ............................................ H01L 27/14
[52] U.S. Cl. .......................................... 357/30; 357/2; 357/58; 357/32; 136/258
[58] Field of Search ................. 357/30 K, 30 A, 30 G, 357/30 J, 31, 32, 2, 41, 58; 136/258

[56] References Cited

U.S. PATENT DOCUMENTS

| | | | |
|---|---|---|---|
| 4,219,831 | 8/1980 | Nonaka et al. | 357/31 |
| 4,323,912 | 4/1982 | Koike et al. | 357/31 |
| 4,360,821 | 11/1982 | Tsukada et al. | 357/30 K X |
| 4,381,517 | 4/1983 | Harada | 357/31 X |
| 4,429,325 | 1/1984 | Takasaki et al. | 357/31 |
| 4,445,131 | 4/1984 | Nonaka et al. | 357/31 |
| 4,581,476 | 4/1986 | Yamazaki | 357/2 X |

FOREIGN PATENT DOCUMENTS

| | | |
|---|---|---|
| 0040076 | 11/1981 | European Pat. Off. . |
| 49-24619 | 3/1974 | Japan . |
| 52-144992 | 2/1977 | Japan . |
| 57-21876 | 2/1982 | Japan . |
| 57-65652 | 4/1982 | Japan . |
| 58-130578 | 8/1983 | Japan . |
| 61-222383 | 10/1986 | Japan . |

OTHER PUBLICATIONS

Nishizawa et al., "Field-Effect Transistor Versus Analog Transistor (Static Induction Transistor)", *IEEE Transactions on Electron Devices*, vol. ED-22, No. 4, Apr. '75, 185-97.

Wu et al., "Amorphous Silicon Phototransistor on a Glass Substrate", *IEEE Transactions on Electron Devices*, vol. ED-32, No. 11, Nov. 1985, pp. 2192-2196.

Tsukada et al., "New Solid-State Image Pickup Devices Using Photosensitive Chalcogenide Glass Film", IEEE 1979 International Electron Devices Meeting, Washington, D.C., Dec. 3-5, 1979, pp. 134-136.

Maruyama, "Amorphous Built-in-Field Effect Photoreceptors", *Japanese Journal of Applied Physics*, vol. 21, Feb. 1982, No. 2, Part 1, pp. 213-223.

Juska et al., "Features of Hot Carriers in Amorphous Selenium", *Phys. Stat. Sol.* (a), 77 (1983), pp. 387-391.

Umebu et al., "Ionization Coefficients Measured in Abrupt InP Junctions", *Appl. Phys. Lett.*, 35 (4), 15 Feb. 1980, pp. 302-303.

Juska et al., "Impact Ionization and Mobilities of Charge Carriers at High Electric Fields in Amorphous Selenium", *Phys. Stat. Sol.* (a), 59 (1980), pp. 389-392.

Grant, "Electron and Hole Ionization Rates in Epitaxial Silicon at High Electric Fields", *Solid-State Electronics*, vol. 16, 1973, pp. 1189-1203.

Sze, *Physics of Semiconductor Devices*, Wiley-Interscience, New York, 1969, pp. 56-65.

*Primary Examiner*—William Mintel
*Attorney, Agent, or Firm*—Antonelli, Terry, Stout & Kraus

[57] ABSTRACT

Disclosed is a photoelectric conversion device which comprises: a photoconductive layer made of amorphous semiconductor material which shows charge multiplication and which converts photo signals into electric signals; and a substrate having electric circuits or the like (for example switching elements) for reading the electric signals. The amorphous semiconductor material used according to the invention shows the charge multiplication action under predetermined intensity of electric field so that a high sensitive photoelectric conversion device having a gain which is not smaller than 1 is realized.

21 Claims, 4 Drawing Sheets

AMORPHOUS PHOTOELECTRIC CONVERSION DEVICE WITH AVALANCHE

CROSS REFERENCE TO RELATED APPLICATIONS

This application is a continuation application of application Ser. No. 07/143,388, filed Jan. 13, 1988, now abandoned.

BACKGROUND OF THE INVENTION

1. Field of the Invention

The present invention generally relates to a photoelectric conversion device for converting a photo signal into an electric signal, and particularly relates to a photoelectric conversion device which uses an amorphous semiconductor having a charge multiplication action so as to realize high sensitivity. The photoelectric conversion device according to the present invention includes an image pickup device of the photoconductive film lamination type, for example, a one-dimensional image sensor, a two-dimensional image sensor, etc.

2. Description of the Related Art

Conventionally, as the photoelectric conversion device mainly constituted by an amorphous semiconductor, known are such a photocell and a one-dimensional image sensor as disclosed in JP-A-52-144992, and such a two-dimensional image sensor (hereinafter, referred to as "solid-state photoconductive device of the photoconductive film lamination type") which is constituted by a combination of a solid state drive circuit and an amorphous photoconductive material as disclosed in JP-A-49-24619.

As photoelectric conversion portions of these photoelectric conversion devices, there are known two types: one which itself has no multiplication function and the other which itself has a multiplication function.

With regard to the available photocells, one-dimensional image sensors and solid-state imagers of the photoconductive film lamination type, the most of them belong to the former type i.e., the one which itself has no multiplication function, and the photoelectric conversion portion of the former type is further classified into two types depending upon whether charge injection from the electrode thereof is present or not. A first one is of a so-called blocking type in which the charge injection from the electrode thereof into the photoconductive film is blocked and a second one is of an injection type in which such charge injection is allowed. Of these two types, the blocking type devices are generally utilized for a case wherein a good photo-response is required. In this case, however, it is impossible to derive signal charges greater than the number of carriers produced by the incident light. That is, the gain of photoelectric conversion is 1 at best. In the injection type device, on the other hand, a high sensitization of a gain larger than 1 can be realized because, in principle, charges more than the number of the incident photons can be derived into an external circuit. In this system in which charges are partly injected into the inside of a sensor, however, the photo-response is considerably deteriorated.

With regard to the photoelectric conversion devices of the type in which a photoelectric conversion portion thereof has a multiplication function, the following devices have been heretofore proposed. A first type device is of the type which comprises an injection type electrode and a gate which opens in response to light in the photoelectric conversion portion thereof. As devices belonging to this first type device, for example, there has been proposed an image pickup device in which an amorphous semiconductor photoconductive layer having phototransistor characteristics and a read-out circuit are laminated one on the other, as disclosed in JP-A-61-222383, and also, there has been proposed a device utilizing a transistor of the electrostatic induction type as discussed in IEEE TRANSACTION ON ELECTRON DEVICES (vol. ED 22, 1975, pages 185-197). Either of these devices basically belongs to the injection type and the device utilizing amorphous semiconductor suffers from disadvantages such as a slow response, in particular. Further, in the transistor of the electrostatic induction type, an amplification portion is provided therein for every picture element, and therefore it is necessary to provide a complicated process so as to make amplification factors for the respective picture elements agree with each other. As a second type device, there has been proposed a system such as the one disclosed in JP-A-57-21876 in which $p^+/\pi p/n/n^+$ junctions are formed in amorphous silicon containing hydrogen in the same manner as in crystal silicon to thereby generate an avalanche action at the p/n junction so as to perform signal amplification. In this system, a good photo-response is obtained because the structure of this system is such that the charge injection from the electrode into the photoelectric conversion portion is blocked, while since the depletion layer thereof is not widened much, it suffers from a disadvantage that a satisfactory amplification factor is not always obtained.

As has been mentioned, the performance of presently available photoelectric conversion devices such as a photocell, a one-dimensional image sensor and a solid state imager of the photoconductive layer lamination type is not satisfactory and there has been a strong demand for an increased sensitivity and an improved performance.

SUMMARY OF THE INVENTION

It is therefore an object of the present invention to solve the foregoing conventional problems.

Namely, it is an object of the present invention to provide a photoelectric conversion device of high sensitivity such as a gain of photoelectric conversion larger than 1 and having a good photo-response.

It is a further object of the present invention to provide a photoelectric conversion device which is simple in structure and easy to manufacture.

It is still another object of the present invention to provide a photoelectric conversion device having a small dark current.

It is a still further object of the present invention to provide a photoelectric conversion device having a homogeneous photoconductive layer which is easily increased in area.

In order to attain the above and other objects, the photoelectric conversion device according to the present invention comprises a substrate provided with an electrode for reading an electric signal, a semiconductor layer provided on the substrate for generating the electric signal corresponding to an external photo signal, and a conductive layer provided on the semiconductor layer, where the semiconductor layer includes a photoconductive layer of a material mainly containing an amorphous semiconductor having a charge multiplication action.

The inventors of this application have carried out various experiments as to the amorphous semiconductor material and found that when a strong electric field is applied to the amorphous semiconductor material, a charge multiplication action (an avalanche effect) is caused inside the amorphous semiconductor material. No one has ever confirmed such a multiplication phenomenon as described above before the inventors of this application have made the confirmation.

According to the present invention having the foregoing structure using such an amorphous semiconductor, it is possible to obtain a photoelectric conversion device which is excellent in photo-response and which has a gain larger than 1 to make the sensitivity high.

BRIEF DESCRIPTION OF THE DRAWINGS

The present invention will be apparent from the following detailed description taken in conjunction with the accompanying drawings, in which.

DESCRIPTION OF THE PREFERRED EMBODIMENTS

Figure 1:
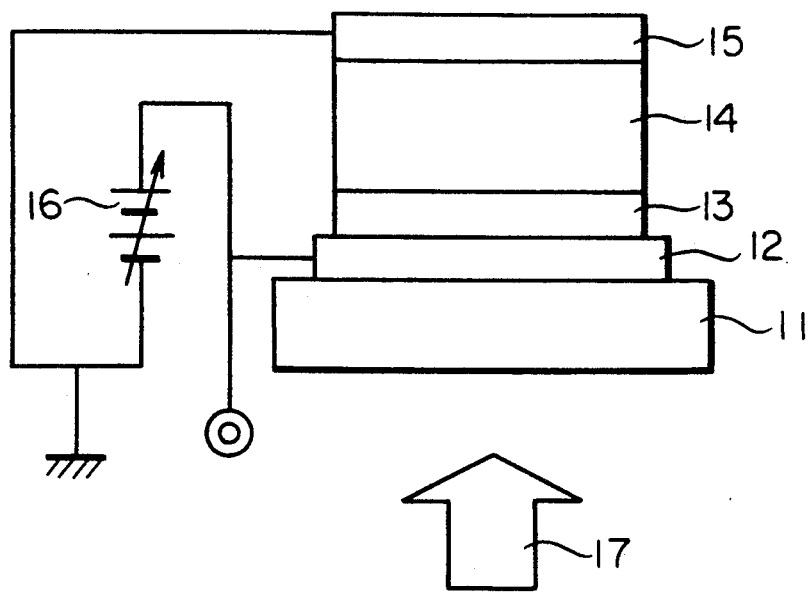
FIG. 1 is a diagram showing a device formed to confirm the charge multiplication action of the amorphous semiconductor material utilized according to the present invention.

First, referring to FIGS. 1 and 2, the charge multiplication action of the amorphous semiconductor will be described. In order to confirm the charge multiplication action of the amorphous semiconductor, a device having such a structure as shown in FIG. 1 was produced. A light-transmissible electrode 12, a thin cerium oxide layer 13, an amorphous selenium layer 14, and a Au electrode 15 were laminated in order on a light-transmissible glass substrate 11. The thus arranged device was connected to a power source 16 for applying an electric field so that the light-transmissible electrode 12 had positive electric potential relative to the Au electrode 15, and the device was irradiated with incident light 17 from the glass substrate 11 side.

Figure 2:
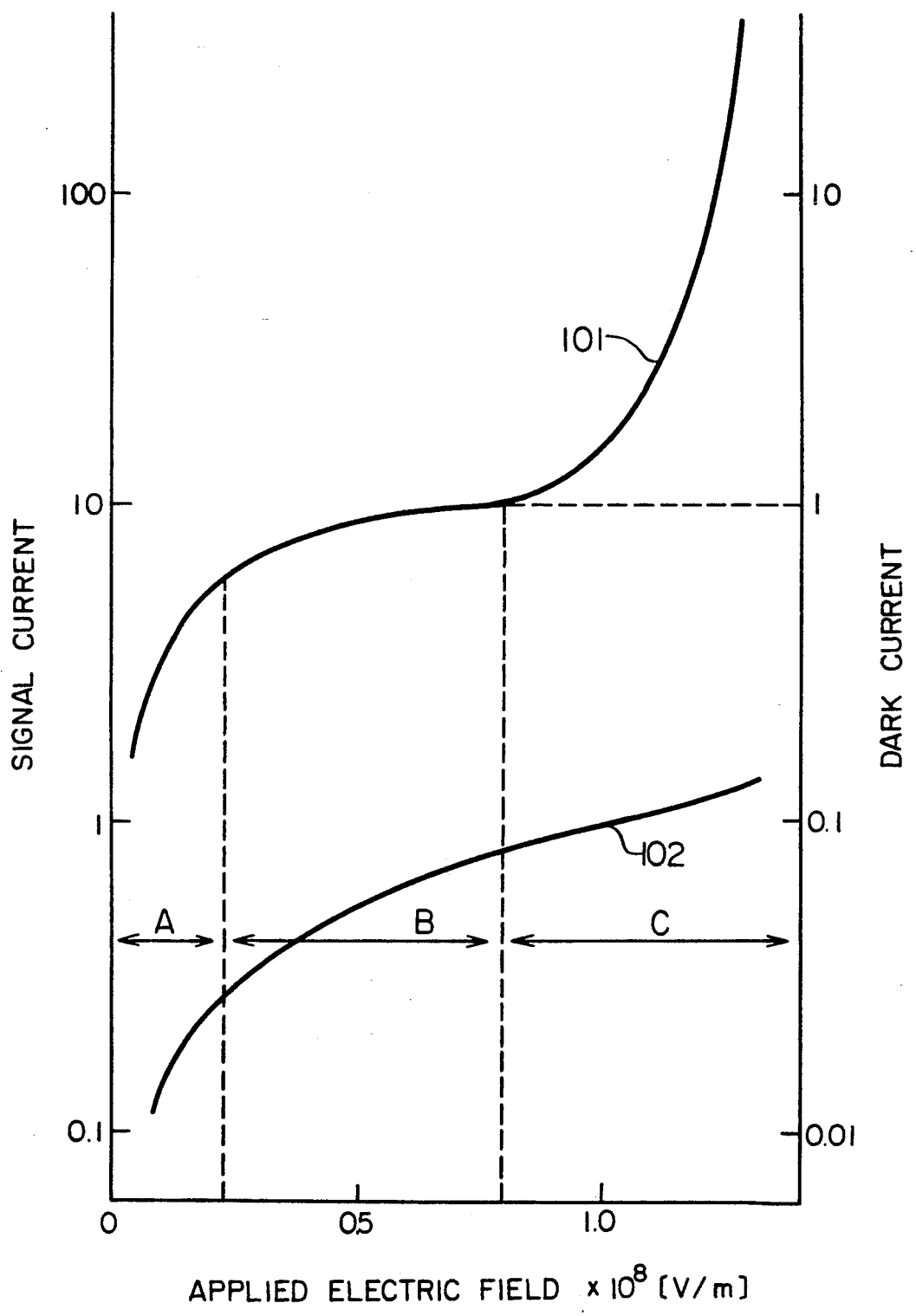
FIG. 2 is a diagram for explaining the charge multiplication action of the amorphous semiconductor material utilized according to the present invention.

In FIG. 2, curves 101 and 102 show the relation between a signal current and an applied voltage and the relation between a dark current and the applied voltage in this device respectively. In the drawing, the applied voltage is represented by the electric field intensity (the ordinate).

The thin cerium oxide layer 13 is formed so as to prevent positive holes from being injected into the amorphous selenium layer 14 from the light-transmissible electrode 12. Further, since the quantity of electrons injected into the amorphous selenium layer 14 from the Au electrode 15 is very small, this device operates as a so-called device of the charge-injection blocking type.

As seen from FIG. 2, the curve 101 showing the relation between the signal current and the applied voltage is formed of three regions A, B and C.

In the region A, the incident light 17 passed through the light-transmissible glass substrate 11 is absorbed in the amorphous selenium layer 14 to thereby generate electron-hole pairs, and the electron-hole pairs are partly separated from each other by the applied voltage, so that the electrons move toward the light-transmissible electrode 12 and the holes reach the Au electrode 15 so as to be derived into an external circuit. In this electric field region, although the signal current increases as the intensity of electric field is made high, the signal current is exceedingly affected by recombination of the electrons with the holes, so that the gain of the device is not larger than 1.

When the applied voltage is further made higher so as to be in the region B of FIG. 2, almost all the electron-hole pairs generated by the incident light 17 are separated from each other by means of the electric field, so that the electrons and the holes run toward the light-transmissible electrode 12 and the Au electrode 15, respectively, without being recombined with each other.

In the region B, the signal current begins to show a tendency to saturate. However, since the signal current becomes maximum when the incident light 17 is entirely converted into electron-hole pairs so as to be derived as the signal current, and therefore the gain of the photoconductive film becomes 1 at the most. The photocell, the one-dimensional image sensor, and the solid-state photoconductive device of the photoconductive film lamination type which have been described in the foregoing item "Description of the Related Art" are made to operate in the foregoing region A or B.

The inventors of this application have found the fact that in the case where the photoconductive film is formed by amorphous selenium, if the applied electric field is made further stronger from the foregoing region B, there occurs such a phenomenon that the signal current increases rapidly so that the gain becomes larger than 1. The signal current increase phenomenon in the amorphous selenium layer has not been made sufficiently clear yet. However, the charge multiplication action in the photoelectric conversion device according to the present invention is different from that caused by charge injection which has been explained in the foregoing item "Description of the Related Art", because the increase of the dark current is not recognized in the region C as seen from the curve 102 of FIG. 2, and when the film thickness of the amorphous selenium layer is increased, the multiplication factor of the signal current with respect to the same intensity of electric field increases. That is, this is the charge multiplication action in an amorphous selenium layer which has never been known.

Utilizing such a phenomenon that a charge multiplication action is generated in the inside of an amorphous selenium layer when a strong electric field is applied to the amorphous selenium layer, a highly sensitive photoelectric conversion device having a gain larger than 1 can be obtained without deteriorating the good photo-response of the photoelectric conversion device having a blocking type structure if an amorphous semiconductor layer which can generate such a charge multiplication action is put on a signal read-out circuit.

Figure 3:
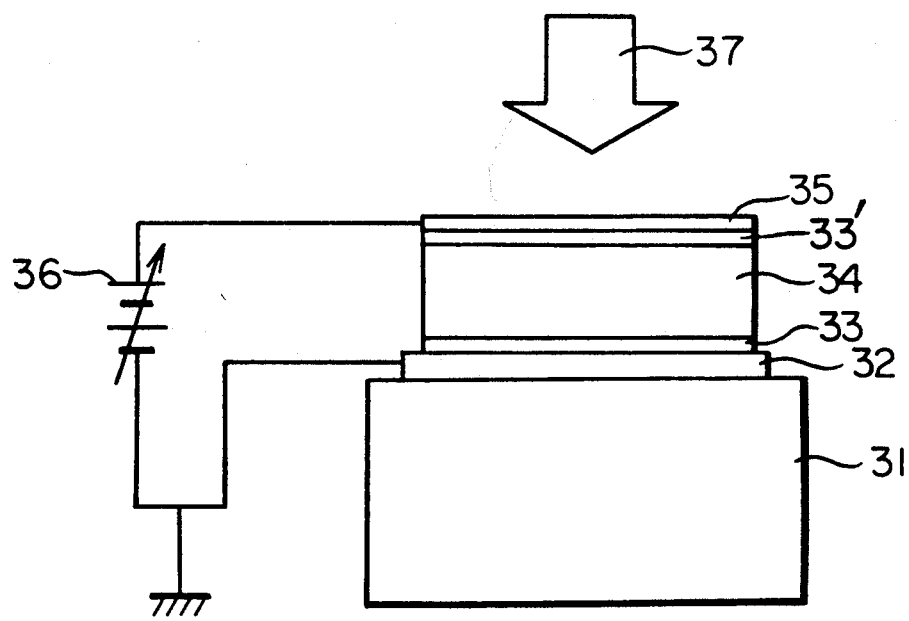
FIG. 3 is a schematic diagram showing an embodiment of the photoelectric conversion device according to the present invention.

FIG. 3 is a diagram showing a further embodiment of the principle of a photoelectric conversion device according to the present invention. The photoelectric conversion device is basically constituted by a substrate 31 provided with a signal-reading scanning circuit formed thereon, a signal reading electrode 32, an amorphous selenium layer 34, and a light-transmissible conductive film 35. If a sufficient rectification contact can not be obtained between the signal reading electrode 32 or the counter electrode 35 and the amorphous selenium layer 34, auxiliary rectification contact layers 33, 33' may be interposed therebetween so as to strengthen the function of rectification contact.

An electric field corresponding to the region C of FIG. 2 is applied to the photoelectric conversion device having the structure of FIG. 3 by using an external voltage application means 36 in the direction for making the light-transmissible conductive film 35 have positive electric potential. When the photoelectric conversion device is irradiated with incident light from the light-transmissible conductive film 35 side in this state, the incident light 37 is absorbed in the amorphous selenium layer 34 to thereby generate electron-hole pairs therein. Of those electron-hole pairs, the electrons flow toward the light-transmissible conductive film 35, and, on the other hand, the holes run toward the signal reading electrode 32 through the amorphous selenium layer 34.

Accordingly, if the amorphous selenium layer 34 is made thick so that the charge multiplication action is caused when the holes run through the amorphous selenium layer 34 under the high electric field to thereby obtain desired characteristics, multiplication of charges is generated to thereby obtain high sensitivity which can make the gain larger than 1 while maintaining the good photo-response.

In a crystal semiconductor material, generation of such a charge multiplication action has been already known as an avalanche amplification phenomenon. In the crystal semiconductor material, however, microplasma is generated and a large dark current of $10^{-9}$ A/mm$^2$ flows. Therefore, when a sectional area of the device is large, there has been a problem that the dark current can not be suppressed to a small value. Accordingly, the crystal semiconductor material has never been practically used for a two-dimensional photoelectric conversion device such as an image pickup device or the like. In the amorphous semiconductor material, on the other hand, it has been generally considered that the charge multiplication action as described above is not caused in a semiconductor layer itself because of its internal defects. However, as the results of various experiments and investigations, the inventors of this application have found the fact that the charge multiplication action exists in amorphous selenium and a dark current in the amorphous selenium is only one percent or less of that in the crystal semiconductor material even in the case of a large sectional area of the amorphous selenium.

Furthermore, as the results of detailed investigations, the inventors of this application have found that the charge multiplication action in the amorphous selenium is caused by positive holes to a great extent, while caused by electrons slightly. Therefore, in the case in which the foregoing charge multiplication action is utilized for the photoelectric conversion device, the multiplication of charges can be efficiently performed with low noise if an electric field is applied so as to make mainly the hole run in a film. Furthermore, the device according to the present invention which uses amorphous selenium is remarkably effective in that the amorphous selenium can be easily formed as a homogeneous thin film having a large area and can be deposited on a signal reading circuit substrate through a simple process, and in that a uniform multiplication factor can be obtained in the amorphous selenium.

Although the above description has been made as to the photoelectric conversion device using the charge multiplication action in the amorphous selenium, it has been found that the foregoing effects of the charge multiplication action can be held even when arsenic and/or germanium is added to the amorphous selenium for the purpose of increasing thermal stability of the latter. Furthermore, for example, tellurium or the like may be added for the purpose of increasing the sensitivity to light of a long wavelength. Moreover, it is not always necessary to form the photoconductive layer by a single photoconductive film of amorphous selenium, but the device may be provided with a lamination of photoconductive layer constituted by two kinds or more of amorphous semiconductor layers having the same charge multiplication action as that of the amorphous selenium. Furthermore, it is not necessary to form the whole of the photoconductive layer by only the amorphous semiconductor, but one may use a lamination of crystal and amorphous semiconductor layers. That is, in the photoelectric conversion device according to the present invention, it is necessary that an amorphous semiconductor is used at least as a part of layers constituting the photoconductive layer and the charge multiplication action is caused in the inside of the amorphous semiconductor layer by application of a strong electric field so as to increase the sensitivity of the device. As seen from FIG. 2, in the amorphous selenium, avalanche multiplication is generated under the electric field intensity of about $8 \times 10^7$ to $2 \times 10^8$ V/m.

The present invention will be described more in detail with respect to further embodiments hereunder.

EXAMPLE 1

Figure 4A:
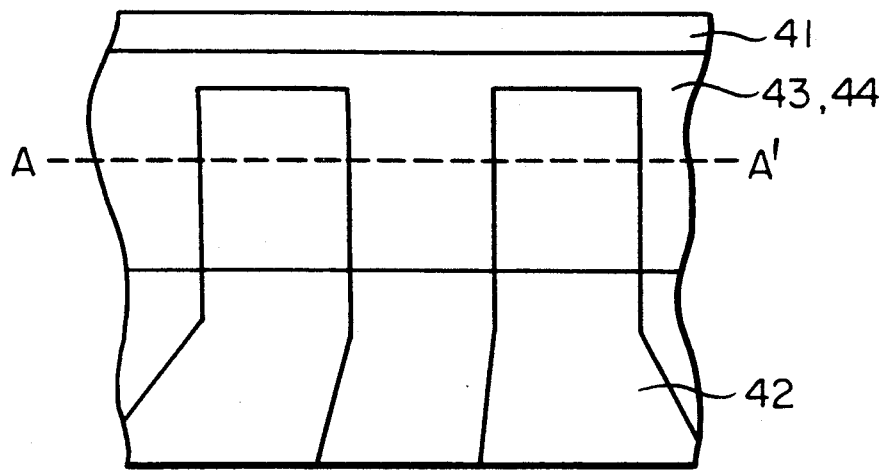
FIGS. 4A and 4B are diagrams showing another embodiment of the photoelectric conversion device according to the present invention.
Figure 4B:
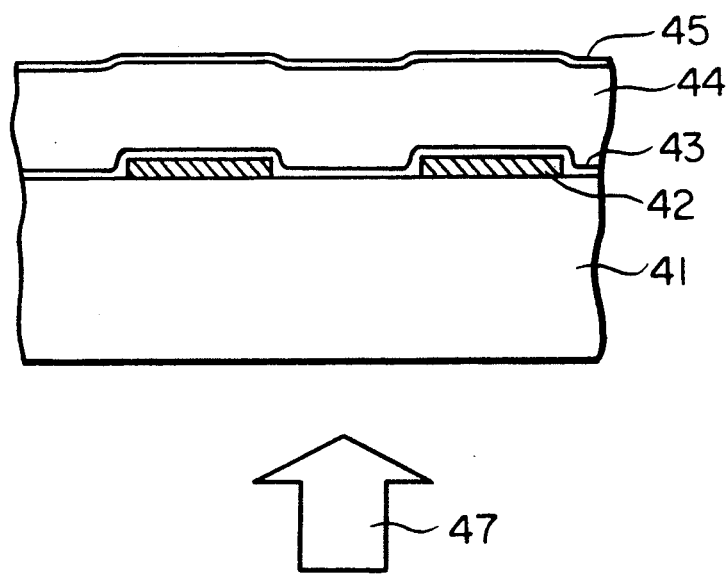

FIGS. 4A and 4B are diagrams for explaining an embodiment of the one-dimensional elongated image sensor according to the present invention, FIG. 4A being a schematic plan showing a portion of the example, FIG. 4B being a cross section taken along dotted line A—A' of FIG. 4A.

A light-transmissible conductive film is formed on a glass substrate 41, and divided by a photoetching process so as to form reading electrodes 42 separated from each other. Next, a CeO$_2$ thin film 43 acting as an auxiliary rectification contact layer and an amorphous selenium layer having a thickness of 0.5-6 μm acting as a photoconductive film 44 are formed by vacuum evaporation over the reading electrodes 42 through a mask having elongated holes. Next, a conductive film 45 is deposited on the amorphous selenium layer by evaporation, sputtering, CVD, or the like so as to form a photoelectric conversion portion. Further, the reading electrodes of the photoelectric conversion portion are connected to a scanning circuit formed on the substrate 41 by bonding or any other suitable means, thereby obtaining a one-dimensional elongated image sensor. An incident light 47 is incident on the sensor in the direction of the arrow as shown in FIG. 4B.

EXAMPLE 2

Figure 5:
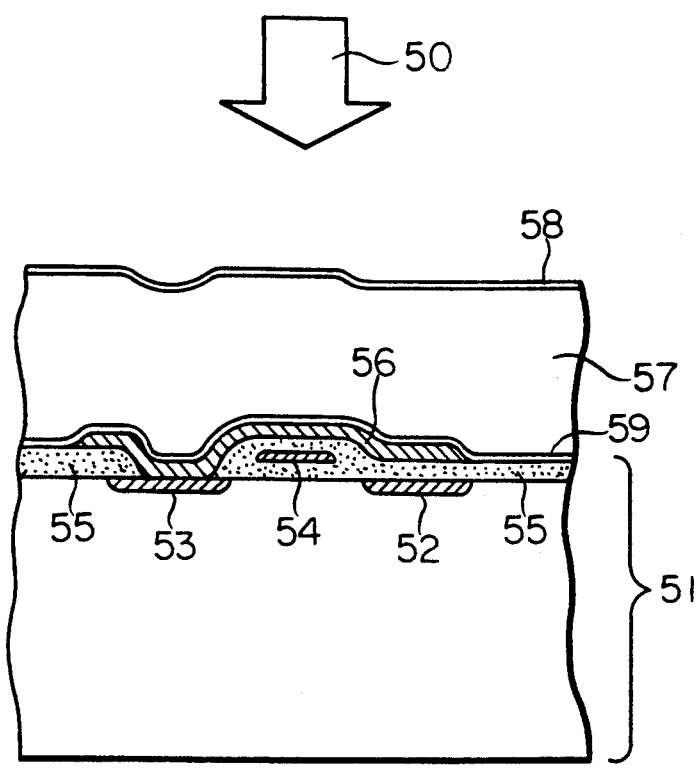
FIG. 5 is a diagram showing a further embodiment of the photoelectric conversion device according to the present invention.

FIG. 5 shows an embodiment in the case where the present invention is applied to a solid-state image pickup device.

As a lower substrate having signal reading and transferring functions, a monocrystalline silicon IC substrate 51, provided at its surface with a two-dimensionally disposed MOS-type switch, is used. The silicon IC substrate 51 is produced through the same process as that in the case of the conventional solid-state image pickup device. The silicon IC substrate 51 is provided with a source electrode 52, a drain electrode 53, a gate electrode 54, insulating layers 55, and an electrode 56 for reading a signal from a photoconductive film. In order to block the carrier injection from the electrode 56, a layer 59, such as a $CeO_2$ thin film, is provided.

An amorphous semiconductor layer 57 having a thickness of 0.5~6 μm and containing selenium as a main component, and also containing arsenic and tellurium, is formed on the foundation substrate 51 in such a manner as described above, through a vacuum evaporation process. In formation of the film, Se, $As_2Se_3$, and Te are simultaneously evaporated from deposition sources separated from each other so as to be deposited on the substrate 51. Further, a light-transmissible conductive film 58 is deposited on the amorphous semiconductor layer 57 by evaporation, sputtering, CVD, or the like to thereby obtain a solid-state image pickup device. An incident light 50 is incident on the device in the direction of the arrow as shown in FIG. 5.

EXAMPLE 3

Figure 6:
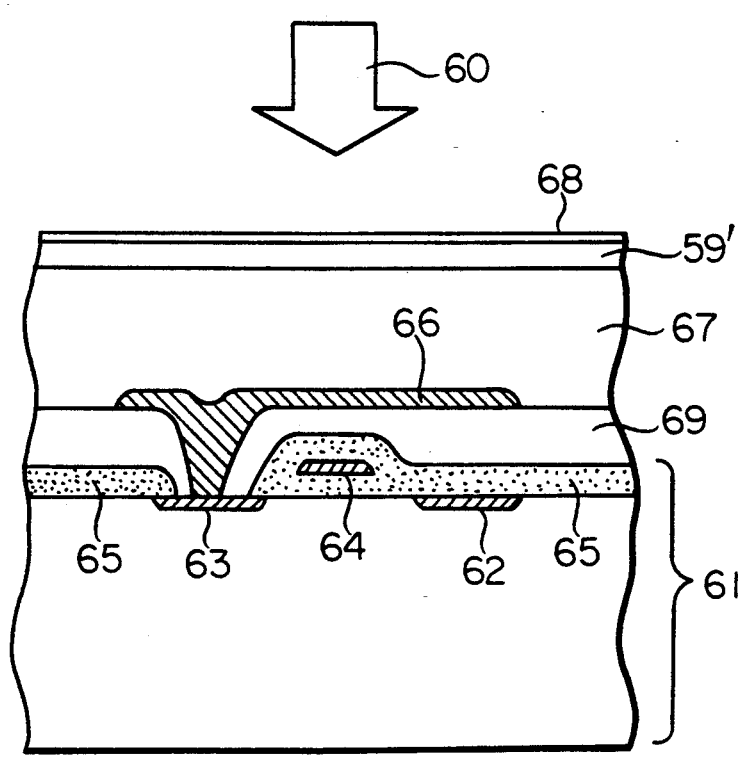
FIG. 6 is a diagram showing a still further embodiment of the photoelectric conversion device according to the present invention.

FIG. 6 shows another embodiment in the case where the present invention is applied to a solid-state image pickup device. Similarly to Example 2, as a lower substrate having signal reading and transferring functions, a monocrystalline silicon IC substrate 61 provided at its surface with a two-dimensionally disposed MOS-type switching element is used. That is, a source electrode 62, a drain electrode 63 and a gate electrode 64 insulated in a predetermined manner by an insulating layer 65 are formed on a base layer of the silicon monocrystal.

Example 3 is different from Example 2 in that an insulating layer 69 of PIQ or the like is formed on the substrate 61 having such a structure formed as described above. The insulating layer 69 is formed to have a thickness of, for example, about several μm. The thickness should be suitably determined in accordance with the evenness of the foundation substrate 61. The insulating layer 69 is formed to make a surface of a signal reading electrode 66 formed thereon flat so that avalanche multiplication can be generated uniformly in a photoconductive film 67, in other words, so that the intensity of electric field can be generated uniformly in the inside of the photoconductive film 67. It is sufficient if the intensity of electric field inside the photoconductive layer 67 is made uniform mainly in an operation region corresponding to an upper portion of the electrode 66.

In this example, a charge-injection prevention layer 59' of $CeO_2$ is formed by a vacuum evaporation process after the photoconductive layer 67 has been formed. This layer 59' is provided to prevent holes from being injected from a light-transmissible electrode 68 at the incident side of a light signal 60 into the photoconductive layer 67.

Although the MOS-type scanning substrate is used as the lower substrate in Examples 2 and 3, it is a matter of course that a CCD-type scanning substrate of the system in which charge carriers stored in electric potential wells by charge transfer are successively transferred so as to be read into an external circuit may be used in place of the MOS-type scanning substrate.

When an electric field of an intensity not smaller than $8 \times 10^7$ V/m is applied to the amorphous selenium photoconductive film of the photoelectric conversion device obtained in the foregoing Examples 1, 2, and 3 to cause the amorphous selenium photoconductive film to operate, signal amplification is caused in the amorphous semiconductor layer, and if the electric field is made to have an intensity of, for example, $1.2 \times 10^8$ V/m, an output having a gain not smaller than 10 relative to a quantity of incident light can be obtained.

What is claimed is:

1. A photoelectric conversion device for imaging, comprising:
   a substrate having a signal-reading scanning circuit thereon;
   a photoconductive region for generating image signals in accordance with external photo image signals, by photoelectric conversion therein, the photoconductive region being formed on said substrate and having an amorphous semiconductor layer for multiplying the image signals through avalanche multiplication, the avalanche multiplication being caused in the inside of the amorphous semiconductor layer;
   a conductive layer formed on said photoconductive region; and
   means for applying an external electric field to the photoconductive region so as to induce avalanche multiplication in the amorphous semiconductor layer.

2. A photoelectric conversion device as claimed in claim 1, wherein said conductive layer is transparent.

3. A photoelectric conversion device as claimed in claim 1, wherein said amorphous semiconductor layer includes amorphous selenium.

4. A photoelectric conversion device as claimed in claim 3, wherein said photoconductive region contains at least one of arsenic and germanium in addition to the amorphous selenium.

5. A photoelectric conversion device as claimed in claim 3, wherein said photoconductive region contains tellurium in addition to the amorphous selenium.

6. A photoelectric conversion device as claimed in claim 1, wherein said amorphous semiconductive layer consists of a plurality of amorphous semiconductor sublayers.

7. A photoelectric conversion device as claimed in claim 6, wherein said plurality of amorphous semiconductor sub-layers have at least an amorphous semiconductor sub-layer including an amorphous selenium layer and an amorphous semiconductor sub-layer including an amorphous silicon layer.

8. A photoelectric conversion device as claimed in claim 7, wherein said amorphous silicon layer contains hydrogen.

9. A photoelectric conversion device as claimed in claim 1, wherein the means for applying an external electric field is a means for applying an external electric field that is sufficiently strong such that a gain in signal current, of the electric signals, of more than one is achieved.

10. A photoelectric conversion device as claimed in claim 1, wherein the conductive layer is a counter electrode of the device.

11. A photoelectric conversion device as claimed in claim 10, wherein the means for applying an external electric field is a means for applying the external electric field between the at least one electrode and the conductive layer.

12. A photoelectric conversion device as claimed in claim 11, wherein the device is adapted to have light irradiated on the substrate or the conductive layer, and the external electric field applying means is a means for applying an external electric field such that the substrate or conductive layer, which is irradiated with light, has a positive electric potential.

13. A photoelectric conversion device as claimed in claim 1, wherein the amorphous semiconductor layer made of amorphous semiconductor material has a thickness of 0.5–6 $\mu$m.

14. A photoelectric conversion device as claimed in claim 1, wherein an insulating layer is provided as part of said substrate so as to flatten the surface upon which the at least one electrode for reading electric signals is formed.

15. A photoelectric conversion device as claimed in claim 1, further comprising blocking means for preventing carriers from being injected from the conductive layer into the photoconductive region so as to keep dark current small.

16. A photoelectric conversion device as claimed in claim 1, wherein the substrate has electrodes for reading the image signals.

17. A photoelectric conversion device as claimed in claim 16, wherein said conductive layer and said photoconductive region have a blocking contact structure for preventing carriers being injected from said electrodes into the photoconductive region.

18. A photoelectric conversion device as claimed in claim 16, wherein said photoconductive region has a blocking layer for preventing carriers being injected from said electrodes into the photoconductive region contacting said conductive layer.

19. A photoelectric conversion device of a solid-state image pickup, comprising:

a photoconductive region having an amorphous semiconductor layer for multiplying image signals which are converted in the photoconductive region from external photo image signals, through avalanche multiplication caused in the amorphous semiconductor layer; and means for applying an external electric field to the photoconductive region so as to induce the avalanche multiplication in the amorphous semiconductor layer.

20. A photoelectric conversion device of a solid-state image pickup as claimed in claim 19, further comprising blocking means for preventing carriers from being injected into the photoconductive region so as to keep dark current small while gain of the image signals is larger than unity.

* * * * *